United States Patent [19]

Longeway

[11] Patent Number: 4,547,648

[45] Date of Patent: Oct. 15, 1985

[54] APPARATUS FOR MOUNTING CRYSTAL

[75] Inventor: Paul A. Longeway, East Windsor, N.J.

[73] Assignee: RCA Corporation, Princeton, N.J.

[21] Appl. No.: 470,572

[22] Filed: Feb. 28, 1983

[51] Int. Cl.[4] .......................... B23K 9/00; B23K 23/00
[52] U.S. Cl. ..................... 219/121 PE; 219/121 PG; 219/494; 219/501; 219/210; 29/25.35; 310/366
[58] Field of Search ............ 219/68, 121 PE, 121 PG, 219/494, 497, 501, 209, 210; 29/25.35; 310/312, 320, 364, 365, 366

[56] References Cited

U.S. PATENT DOCUMENTS

| | | | |
|---|---|---|---|
| 2,602,872 | 7/1952 | Ziegler | 29/25.35 |
| 2,765,765 | 10/1956 | Bigler et al. | 29/25.35 |
| 3,006,711 | 10/1961 | Silver | 29/25.35 |
| 3,721,841 | 3/1973 | Wilson | 29/25.35 |
| 3,724,739 | 4/1973 | Anderson et al. | 29/25.35 |
| 4,216,371 | 8/1980 | Marotel | 219/210 |
| 4,232,239 | 11/1980 | Dworsky et al. | 29/25.35 |

OTHER PUBLICATIONS

Technical Note, No. 002, published 12/19/71, by Kronos, Inc., entitled "QM-300 Series Scale Factor Considerations".
"Workshop Notes and Short Contributions," *Vacuum*, vol. 32, No. 5, pp. 305-307, 1982.

Primary Examiner—M. H. Paschall
Attorney, Agent, or Firm—Birgit E. Morris; Donald S. Cohen; Joseph D. Lazar

[57] ABSTRACT

A thickness monitor useful in deposition or etching reactor systems comprising a crystal-controlled oscillator in which the crystal is deposited or etched to change the frequency of the oscillator. The crystal rests within a thermally conductive metallic housing and arranged to be temperature controlled. Electrode contacts are made to the surface primarily by gravity force such that the crystal is substantially free of stress otherwise induced by high temperature.

5 Claims, 6 Drawing Figures

APPARATUS FOR MOUNTING CRYSTAL

The U.S. Government has rights in this application under contract no. SERI Sub. XG-1-1169-1 with the Solar Energy Research Institute (SERI).

This invention relates to an oscillator crystal that is substantially free of mounting stresses. More particularly, the invention relates to such a crystal used with an in situ film thickness monitor in deposition and etching reactors.

BACKGROUND OF THE INVENTION

Quartz crystals are widely used to control the frequency of oscillation in crystal controlled oscillator. The so-called quartz crystal microbalance is well suited for film thickness monitors in vacuum deposition processes. In general, measurements are carried out by monitoring changes in the resonant frequency of the oscillating crystal. For this purpose monitors usually have at least two circuits, first an oscillator circuit to drive the crystal at resonance and, second, a measuring circuit to monitor the frequency of the crystal and thus its change in frequency changed by the deposited or etched film. See "Workshop Notes and Short Contributions," Vacuum, Volume 32, number 5, pp. 305–307, 1982, for a description of etching and deposition monitoring with an oscillating quartz crystal. See also the Technical Note number 002, published Dec. 19, 1971 by Kronos, Inc., entitled "QM-300 Series Scale Factor Considerations" describing the basic considerations of quartz crystal microbalances.

In conventional reactor systems a major source of error is temperature changes of the crystal caused by radiation occuring within the evaporator. Moreover, errors can occur through the stress effect caused by the manner in which the crystal is mounted within the reactor, particularly during high temperature ambients. Typically, a crystal is mounted under spring tension to establish electrical contact with one surface of the oscillator and to maintain it in position within the housing. At high temperatures, greater than 200° C., for example, the metallic spring electrodes tend to deform and effect undesirable stress on the crystal and thereby alter its resonant frequency. Moreover, in certain reactors, such as glow discharge reactors, both a.c. and d.c. energized, the r.f. fields within the chamber of the reactor adversely affect the resonant frequency of the crystal.

There is a need in the art of crystal-controlled oscillators to minimize the stress effects induced at high temperatures on the crystal and also to reduce the radio frequency effects in reactors in which at least stray radio frequency fields are generated.

SUMMARY OF THE INVENTION

A crystal, used in a crystal-controlled oscillator, is supported and heated in a temperature controlled housing and electrically contacted with stress-loaded electrodes. In a reactor system for deposition or etching, the film thickness of a specimen is monitored by oscillator frequency changes effected by film thickness changes on the crystal surface.

DETAILED DESCRIPTION OF THE PREFERRED EMBODIMENT

While the invention will be described in use with a glow discharge reactor system for depositing, for example, amorphous silicon on a silicon substrate, the invention can be used in other environments such as for etching processes.

Figure 1:
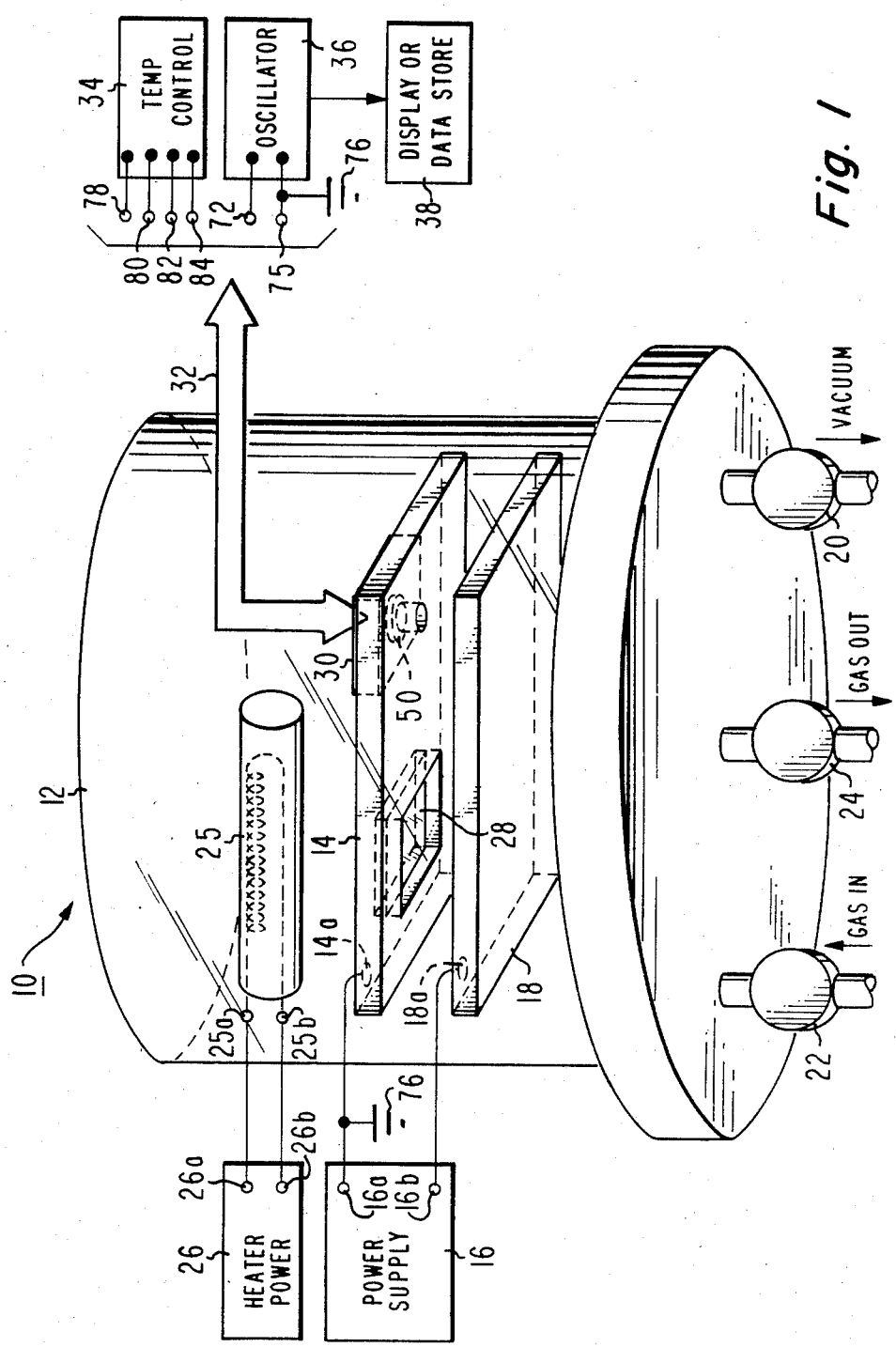
FIG. 1 is a schematic of a system suitable for utilizing the thickness monitor of the invention.

Reference is made to FIG. 1 illustrating the invention used in a glow discharge apparatus. Apparatus 10 includes a vacuum chamber 12 which is suitably a glass bell jar. In the chamber 12 are two generally horizontally disposed electrodes 14 and 18 which can be in the form of plates of material that is a good electrical conductor and does not readily react or sputter in the chamber. Such material can be of steel or molybdenum. The electrodes are connected to a power supply 16, which in the present embodiment is d.c. Electrode 14 is connected to power supply 16 through terminals 14a and 16a. Electrode 18 is connected to power supply 16 via terminals 18a and 16b. Thus, there will be a voltage potential between the electrodes 14 and 18.

An outlet 20 from the vacuum chamber 12 allows for evacuation of the system and is connected to a mechanical pump, not shown. A first inlet 22 and a second inlet 24 are connected to gas bleed systems, not shown, for adding and discharging the reactants employed to operate the reactor apparatus 10. A heating lamp 25 is energized by heating power supply 26 via terminals 25a to 26a and 25b to 26b.

A substrate 28 is positioned within electrode 14 to be exposed towards the electrode 18 to the reactant gases. A crystal housing 30 is mounted within electrode 14 such that a crystal 50 faces the electrode 18 and is thereby subject to the same reaction process as that of the substrate 28. The housing 30 is connected by electrical conductors 32 through the chamber 12 to external circuits comprising a temperature control circuit 34, an oscillator 36 and a display or data storage circuit 38.

In operating the apparatus 10 according to conventional processes, the substrate 28 to be coated with an amorphous silicon material is placed in the electrode 14 and is spaced from the electrode 18 by about 5–10 centimeters. The vacuum chamber 12 is evacuated to a pressure about $0.5$–$1 \times 10^{-6}$ torr through output 20. Silane ($SiH_4$) is added through port 22 and out through port 24 until a desired partial pressure of the silane is obtained. The deposition process is monitored by the crystal 50 in the housing 30 being deposited with amorphous silicon at the same time the amorphous silicon is deposited on the bottom surface of the wafer 28. The oscillator 36 responding to the change of mass of the crystal will have its frequency change as a function of that change in the mass. The frequency change is calibrated to thicknesses which is displayed or stored in data form in circuit 38 for future use.

Figure 2:
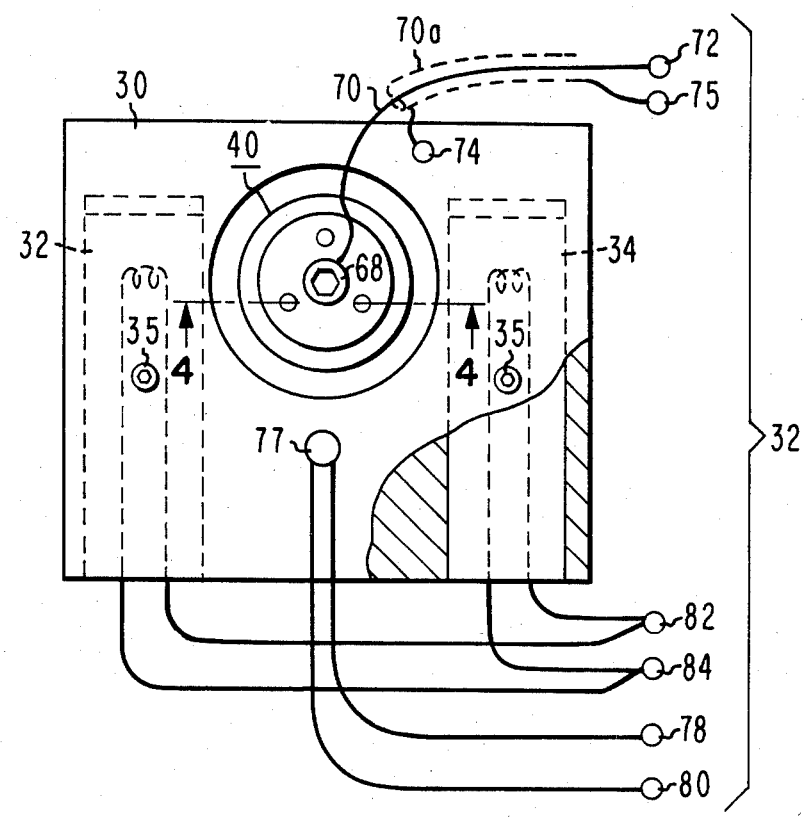
FIG. 2 and 3 are detailed top plan and side elevation views, respectively, of the monitor shown in FIG. 1.
Figure 3:
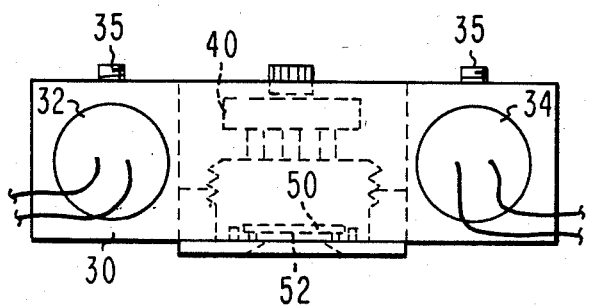
Figure 4:
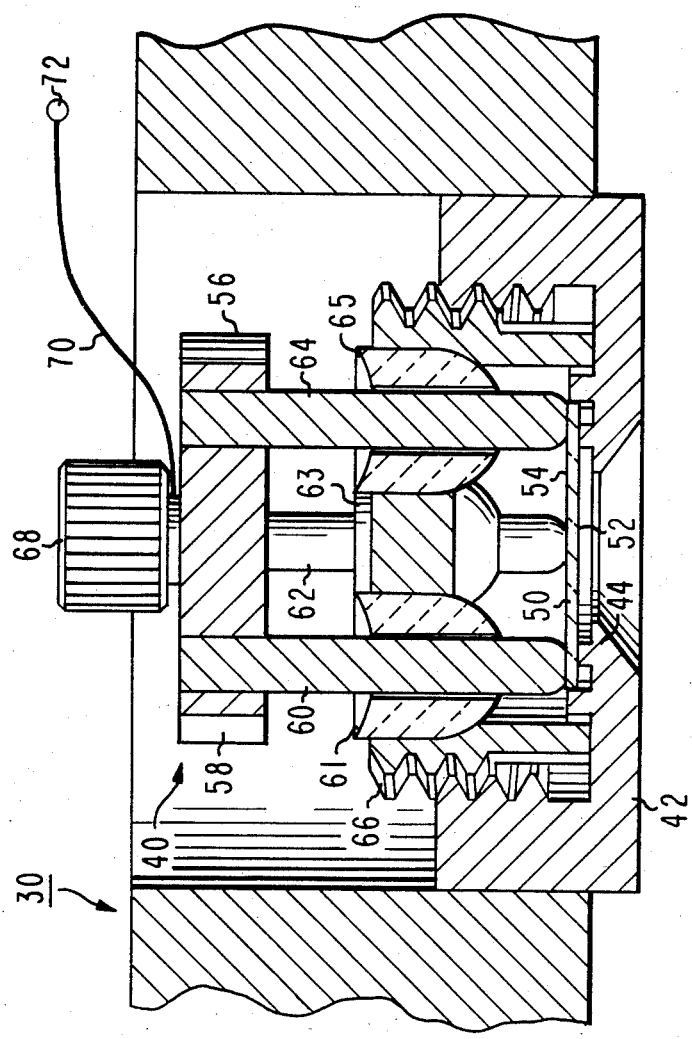
FIG. 4 is a sectional view in side elevation as seen along viewing line 4—4 of FIG. 2.

The crystal housing 30 is shown in top plan view in FIG. 2 and in side elevation view in FIG. 3. A sectional view along viewing lines 4—4 of FIG. 2 is shown in FIG. 4 showing details of the crystal mounting assembly 40. The housing 30 is a stainless steel block having dimensions of about 3×3×1 inches (7.5×7.5×2.5 centimeters) having recesses for receiving heater elements 32 and 34, which, when inserted in the recesses, are maintained in position by set screws 35. A cylindrical aperture is formed in the block 30 to receive the crystal mounting assembly 40 which includes a first member 42 having a shoulder portion 44 for supporting the crystal 50 on its bottom surface 52. The upper surface 54 of the crystal is contacted by a tripod 56 serving as one electrode for contacting the crystal 50. The tripod 56 comprises an upper planar member 58 having three pins serving as electrodes 60, 62, and 64 rigidly attached thereto. The tripod 56 is supported in a member 66 threadably engaged within the member 42. Three ceramic tubular beads 61, 63 and 65 are positioned in apertures within member 66 to receive the electrodes 60, 62 and 64 in a generally vertical path. Beads 61, 63 and 65 electrically insulate the housing 30 and insert members 42 and 66 from the electrodes 60, 62, and 64. Electrical connection is made to the tripod 56 via a terminal screw 68 to which is connected a grounded shield coaxial lead 70 entending through the chamber 12 to terminal 72. Terminal 72 is connected to the oscillator 36 while the reference ground is derived from terminal 74 (FIG. 2) and thence to a terminal 75 via the shield 70a. Terminal 75 is connected to the reference ground 76 of the system which also is the reference ground connected to the power supply 16. The electrode 14 is referenced to the ground system 76 except for the electrically insulated tripod 56 serving as the electrode for connection to one side, namely, the top surface 54 of the crystal 50.

A thermocouple 77 mounted within the crystal housing 30 and near the crystal mounting assembly 40 senses the temperature of the housing. The thermocouple is connected at terminals 78 and 80 through wires to the external temperature control circuit 34. Electrical leads are connected to the heaters 34 and are terminated at terminals 82 and 84. Terminals 82 and 84 are connected to the temperature control 34 external to the reactor 10 to provide temperature control of the housing 30 and thus of the crystal 50. The crystal 50 being disposed within the housing 30 is heated by the good thermal stability of stainless steel by both conductive and radiant heating within the chamber of housing 30 in which the crystal mounting assembly 40 is positioned.

Since the electrode 14 is grounded via the system ground 76 the structure of the crystal housing 30 being of steel substantially surrounding the crystal 50, the crystal is shielded at least from stray r.f. fields that may exist in the vicinity of the crystal 50. Accordingly, the crystal housing 30 serves as a Faraday cage for the crystal 50. Moreover, the crystal oscillator is suitably buffered by a circuit such as that described in the above-identified article in Vacuum, and is placed outside of the vacuum chamber 12. The oscillator itself is thereby stable and isolated from r.f. effects.

Figure 5:
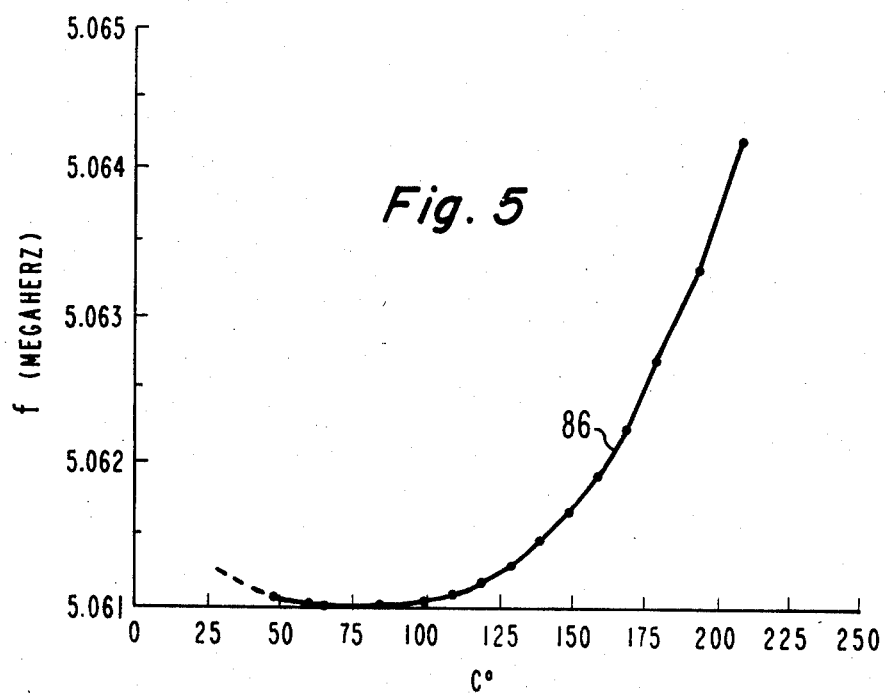
FIG. 5 is a plot of experimental data of crystal oscillator frequency as a function of temperature.
Figure 6:
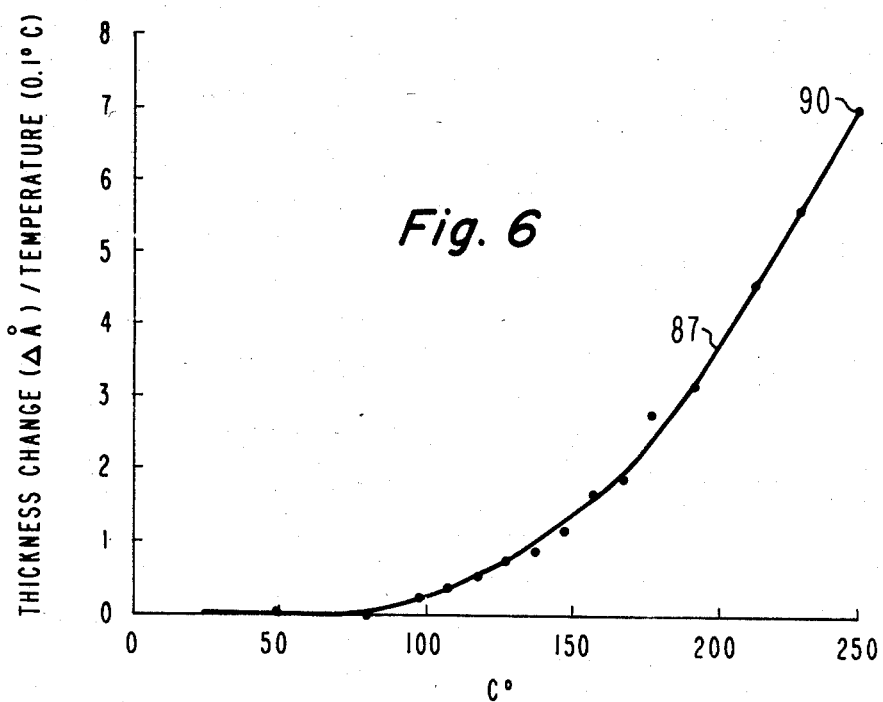
FIG. 6 is a plot of experimental data showing the thickness change per 0.1° C. on the surface of the crystal of the monitor as a function of in situ temperature.

To better appreciate the problems solved by the reduced-stress mechanism that is provided to minimize the effects of stress deviations in the oscillator crystal, reference is made to FIGS. 5 and 6. FIG. 5 illustrates a typical test curve 86 showing the response characteristics of the crystal resonant frequency as a function of temperature. It is noticed that the frequency is relatively stable in the region of 50° to 100° C. However, as the temperature rises above that temperature and approaches 250° C. the curve has a very sharp knee and large slope frequency changes occur for small changes in temperature. Accordingly, for a system utilizing a crystal for controlling the frequency of an oscillator it is quite important that the temperature be kept stable.

Reference is now made to FIG. 6 illustrating the characteristic response curve 87 of a crystal that serves as a film thickness monitor. The thickness change ($\Delta$ Angstroms) per change in temperature of 0.1° C. is plotted against the temperature at which the thickness change occurs. Point 90 illustrates that at a temperature of 250° C. a thickness change of 7 angstroms can be expected for a deviation of 0.1° Celsius.

According to the invention, the temperature of the crystal 50 is maintained to a substantially constant value within the critical limit of 0.1° C. Moreover, since the wafer is substantially free of r.f. interference, the frequency of the crystal 50 will be subject only to mass and stress effects. The stress on the wafer 50 is virtually reduced to zero, according to the invention, by making contact to the upper and lower surfaces of the wafer by means of stress-free contacts. The tripod 56 defines a plane at the end of the three electrodes 60, 62 and 64 each of which are of the same length. Therefore the three end points of the tripod electrodes will rest on a plane of the surface 54 of the wafer 50. Any deformation of the wafer 50 which will affect the flatness of the surface 54 will have no effect on the electrical contact of the electrodes thereon. The electrodes 60, 62 and 64 moreover are in the ceramic insulator 61, 63 and 65 and in a loose fitting way so that any tilting of the plane defined by the surface 54 will not affect the stress-free contact. Thus, the inside diameter of each insulator is larger than the diameter of each electrode. The bottom surface 52 of the crystal is merely resting primarily by gravity force on the shoulder portions 44 of the member 42 and is thus free of any mechanical stress that would otherwise affect the frequency of the crystal 50.

In operation, the bottom surface 52 of the crystal 50 being exposed to the ambient will receive substantially the same deposition of amorphous silicon that is received on the bottom surface of the wafer 28 positioned adjacent the crystal housing 30 on the electrode 14. As the thickness of the amorphous silicon increases on the surface 52, the frequency of the oscillator 36 changes. Suitable calibration is provided to indicate what the thickness changes are as a function of frequency deviation. The display 38 is provided to get an instantaneous display on an oscilloscope, for example, of the change in thickness. Moreover, if it is desired, the data can be stored in a suitable data storage facility such as the memory of a computer.

The invention may be used to determine the reduction of thickness of a film that is being etched, for example, in a plasma etching environment. Accordingly, with the reactor 10 functioning as a plasma etching system, the crystal 50 is first deposited with material that is to be etched from a similar material of coating on a wafer 28 to be etched. As the etching process continues to etch away at the wafer film, the same action will occur on the film pre-deposited on the crystal 50. The changes in the frequency will occur as the mass changes as a result of the etch and by that change in mass, the reducing thickness can be readily known.

Based on experiments, I have determined that the stability of a crystal 50 is substantially constant for thicknesses up to 100 micrometers. This thickness is about 50 times the thickness (2 micrometers) of a typical film on a wafer being deposited with amorphous silicon. The average thickness of the film on a wafer is about 5000 angstroms, which is one-half a micrometer. Accordingly, if one crystal is to serve to monitor the thickness of deposition processes, it could be repeatedly used for about 50 times or 50 process steps. Also, if one were to use the crystal to monitor etching processes, the crystal would be first deposited with a film of about 100 micrometers that would allow for an etching reduction of 50 wafers.

What is claimed is:

1. An apparatus comprising a crystal-controlled oscillator crystal mounted within a structure that can be heated to high temperatures wherein the heat of the structure heats the crystal, and means for supporting said crystal within said structure such that electrical contact with the respectively opposite surfaces of the crystal is made by substantially minimum stress loading by providing a first electrode arranged to rest on and electrically contact thereby one surface of the crystal and a second electrode upon which another surface of said crystal rests by gravity to thereby make electrical contact to said second electrode, wherein said crystal has top and bottom major surfaces and is mounted within said structure and wherein said first electrode means includes means for contacting said top crystal surface including three electrode pins of substantially equal length and rigidly attached to a planar member, insulator tubular means for guiding each of said three respective electrode pins in a generally vertical path, said tubes being of substantially larger inside diameter than the diameter of said electrode pins so that said electrode pins maintain continuous contact with said top crystal surface even with temperature-induced surface deformations.

2. In a deposition or etching reactor system having a thickness monitor positioned in situ to monitor in the chamber of the reactor deposition or reduction in thickness of a film of material on the surface of a specimen, said monitor being of the type having a crystal-controlled oscillator; said system being capable of operating at temperatures up to and on the order of 250° C., characterized by:

means for supporting a crystal having top and bottom major planar surfaces in a generally horizontal position within a metallic housing of good thermal stability such that heat of the housing heats the crystal and such that a portion of the crystal bottom surface is exposed to the reactor ambient to be subject to deposition or etching reactions within said chamber;

means for controlling the temperature of said housing to a predetermined temperature whereby the temperature of the crystal is controlled to a substantially constant temperature;

first electrode means comprising three commonly electrically connected electrodes arranged to contact by resting on said top crystal surface in a common plane to provide continuous electrical contact therewith;

second electrode means comprising a ring-like conductive member supporting the bottom crystal surface by the combined weight of said crystal and said three-commonly connected electrodes resting on said top crystal surface to provide electrical contact with said bottom crystal surface; and conductor means connecting, respectively, said first and second electrode means to an oscillator, the frequency of said oscillator being determined by the frequency of said crystal, wherein said first electrode means comprises said three vertically oriented pins rigidly attached at the upper end respectively of each pin to a planar member of relatively large mass compared to the mass of said pins, insulator tubular means for guiding each of said three respective pins downwardly in a generally vertical path, said tubes being of substantially larger inside diameter than the outside diameter of said pins so that the lower end of each of said respective pins maintains contact with said top crystal surface even with temperature-induced surface deformations.

3. The system of claim 2 wherein said reactor system is a glow discharge system for depositing amorphous silicon on a substrate.

4. The system of claim 2 wherein said reactor is operated to provide plasma etching of a wafer having a layer of material, said crystal being coated with a film of said material on the bottom surface thereof, said crystal film being reduced in thickness as the surface of said wafer is etched, the frequency of said oscillator changing as a function of the reduction of film thickness on said crystal.

5. The system of claim 2 where said crystal is positioned within said housing so that stray radio frequency fields are substantially shielded from said crystal.

* * * * *